(12) United States Patent
Agatsuma et al.

(10) Patent No.: US 7,369,594 B2
(45) Date of Patent: May 6, 2008

(54) SEMICONDUCTOR LASER

(75) Inventors: Shinichi Agatsuma, Miyagi (JP); Shiro Uchida, Miyagi (JP)

(73) Assignee: Sony Corporation, Tokyo (JP)

( * ) Notice: Subject to any disclaimer, the term of this patent is extended or adjusted under 35 U.S.C. 154(b) by 133 days.

(21) Appl. No.: 11/276,040

(22) Filed: Feb. 10, 2006

(65) Prior Publication Data
US 2006/0182161 A1 Aug. 17, 2006

(30) Foreign Application Priority Data
Feb. 17, 2005 (JP) ............................. 2005-040462

(51) Int. Cl.
*H01S 5/00* (2006.01)
(52) U.S. Cl. ................. 372/45.01; 372/43.01
(58) Field of Classification Search ............. 372/43.01, 372/45.01
See application file for complete search history.

(56) References Cited

U.S. PATENT DOCUMENTS 7,092,422 B2 * 8/2006 Kan .................. 372/45.01
7,095,769 B2 * 8/2006 Yoon et al. ............... 372/45.01

FOREIGN PATENT DOCUMENTS

JP 2002-198614 7/2002

* cited by examiner

*Primary Examiner*—Dung T. Nguyen
(74) *Attorney, Agent, or Firm*—Sonnenschein Nath & Rosenthal LLP

(57) ABSTRACT

A semiconductor laser of effective index type which has a lower cladding layer, an active layer, and an upper cladding layer, which are sequentially arranged upward, with said upper cladding layer being formed into the stripe ridge structure, wherein the upper cladding layer forming the foot and slope of said stripe ridge structure is covered with a buried layer of layered structure made up of two or more low refractive index layers to prevent absorption of the laser light, with a light-absorbing layer interposed between them which absorbs the laser light of oscillatory wavelength. This semiconductor laser prevents kinks due to higher-order modes, and hence it realizes a high level of output.

4 Claims, 3 Drawing Sheets

US 7,369,594 B2

SEMICONDUCTOR LASER

CROSS REFERENCES TO RELATED APPLICATIONS

The present invention contains subject matter related to Japanese Patent Application JP 2005-040462 filed in the Japanese Patent Office on Feb. 17, 2005, the entire contents of which being incorporated herein by reference.

BACKGROUND OF THE INVENTION

The present invention relates to a semiconductor laser and, more particularly, to a semiconductor laser of effective index type having the stripe ridge structure.

FIG. 2 is a schematic sectional view showing an example of the semiconductor laser of effective index type having the stripe ridge structure. This semiconductor laser is based on AlGaInP and is designed to make recording on a DVD (Digital Versatile Disc).

The semiconductor laser shown in FIG. 2 is comprised of a substrate 101 of n-type GaAs, a lower cladding layer 102 of n-type AlGaInP, an active layer 103 of GaInP, an upper cladding layer 104 of p-type AlGaInP, and a contact layer 105 of p-type GaAs, which are sequentially arranged upward. The contact layer 105 and the upper part of the upper cladding layer 104 form the stripe ridge structure a. The upper cladding layer 104 (spreading over the foot and slope of the ridge a) is covered by the buried film b, which is comprised of a low refractive index layer 106 of AlInP and an anti-oxidizing layer 107 of GaAs. The contact layer 105 is covered by and connected to an upper electrode 108, and the substrate 101 is provided with a lower electrode 109. The buried layer b, which is comprised of a low refractive index layer 106 and an anti-oxidizing layer 107, reduces the internal loss of the laser beam generated, which is disclosed in the Japanese Patent Laid-open No. 2002-198614 (paragraphs 3, 9, and 10) (hereinafter referred to as Patent Document 1).

Any semiconductor laser to be used as an optical pickup for recording is required to have a high output to increase the recording rate. FIG. 3 shows the L-I curve (light output versus current characteristics) of the aforesaid semiconductor laser based on AlGaInP. It is noted from FIG. 3 that the semiconductor laser usually increases in light output almost linearly in proportion to current above the threshold value. Unfortunately, the increased current causes the transverse mode of the laser to shift from the zeroth-order mode (fundamental mode) to the first-order or higher-order mode. As the result, the light output does not increase linearly any longer. This phenomenon is called "kink" (particularly higher-order mode kink). The light output (indicated by Lk in FIG. 3) at which this phenomenon occurs is referred to as the kink level. This kink level Lk often determines the maximum output of the semiconductor laser.

The condition for preventing the higher-order mode kink is represented generally by the equation (1) below.

$$W \leq \frac{\lambda_0}{2\sqrt{n_1^2 - n_2^2}} \quad (1)$$

where,
$n_1$: effective refractive index of ridge a
$n_2$: effective refractive index of buried film b
$\lambda_0$: wavelength of laser beam
W: width of ridge
as shown in FIG. 2.

The equation (1) above suggests a possible way of preventing the higher-order mode kink by reducing the value of W (the width of the ridge) or by reducing the value of $n_1-n_2$ (the difference between the two effective refractive indexes). To achieve this embodiment, there has been proposed an idea of modifying the semiconductor laser shown in FIG. 2 by replacing the low refractive index layer 106 of AlInP with a semiconductor layer of AlGaAs having a refractive index of 3.4 to 3.55. This modification causes the value of $n_1-n_2$ to decrease to 0.001 to 0.005, thereby making it easy to attain the fundamental mode. (See Patent Document No. 1.)

In addition to the above-mentioned two methods, there is a third possible way of preventing the laser transverse mode from shifting from the zeroth-order mode to the higher-mode order. This embodiment is achieved by increasing the coefficient for absorption of higher-order mode in the buried film. A practical structure for this purpose is shown in FIG. 2, in which the low refractive index layer (AlInP) 106 is made thin so that the anti-oxidizing layer (GaAs) 107, which functions also a laser absorbing layer, comes close to the active layer 103.

SUMMARY OF THE INVENTION

The above-mentioned three ways for solutions, however, suffer the following disadvantages.

(1) Narrowing the ridge width (W) increases resistance at the ridge of the semiconductor laser. This in turn generates heat at the time of laser emission, thereby increasing the refractive index ($n_1$) at the ridge. This is unfavorable for the cutoff condition.

(2) Decreasing the difference between effective refractive indexes ($n_1-n_2$) reduces the radiation angle ($\theta_\parallel$) in the horizontal direction at the pn junction of the semiconductor laser. This makes the output lower than necessary for the optical pickup device.

(3) Increasing the coefficient for absorption of higher-order mode in the buried film is effective for absorption of higher-order mode but it also results in absorption of the zeroth-order mode in proportion to the increased coefficient. This is illustrated in FIG. 4, from which it is noted that the coefficient for absorption of the zeroth-order mode [$\alpha_0$] is proportional to the coefficient for absorption of the first-order mode [$\alpha_1$]. Therefore, if the absorption of the first-order mode (or higher-order mode) is increased by reducing the thickness t of the low refractive index layer (AlInP) 106 as shown in FIG. 5, the absorption of the zeroth-order mode is also increased. Thus the third method for solution also involves heat generation in the ridge as in the case of the first method.

According to an embodiment of the present invention, there is provided a semiconductor laser which prevents heat generation and kinks due to higher-order modes, thereby realizing a high output.

The present invention is directed to a semiconductor laser of effective index type which has a lower cladding layer, an active layer, and an upper cladding layer, which are sequentially arranged upward, with the upper cladding layer being formed into the stripe ridge structure, wherein the upper cladding layer forming the foot and slope of said stripe ridge structure is covered with a buried layer of layered structure made up of two or more low refractive index layers to prevent absorption of the laser light, with a light-absorbing layer interposed between them which absorbs the laser light of oscillatory wavelength.

The semiconductor laser constructed as mentioned above excels the conventional one of buried film structure having only one low refractive index layer in that the buried film has the coefficient for absorption of zeroth-order mode which is smaller than the coefficient for absorption of first-order (higher-order) mode. Thus the semiconductor laser having the buried film constructed as mentioned above offers the advantage of reducing absorption of the zeroth-order mode and increasing absorption of the higher-order mode in the buried film, thereby suppressing heat generation and preventing kinks due to higher-order modes.

As mentioned above, the semiconductor laser according to the present invention prevents kinks due to higher-order modes, and hence it realizes a high level of output.

DETAILED DESCRIPTION OF THE PREFERRED EMBODIMENT

The semiconductor laser as an embodiment of the present invention will be described in more detail with reference to the accompanying drawings.

Figure 1:
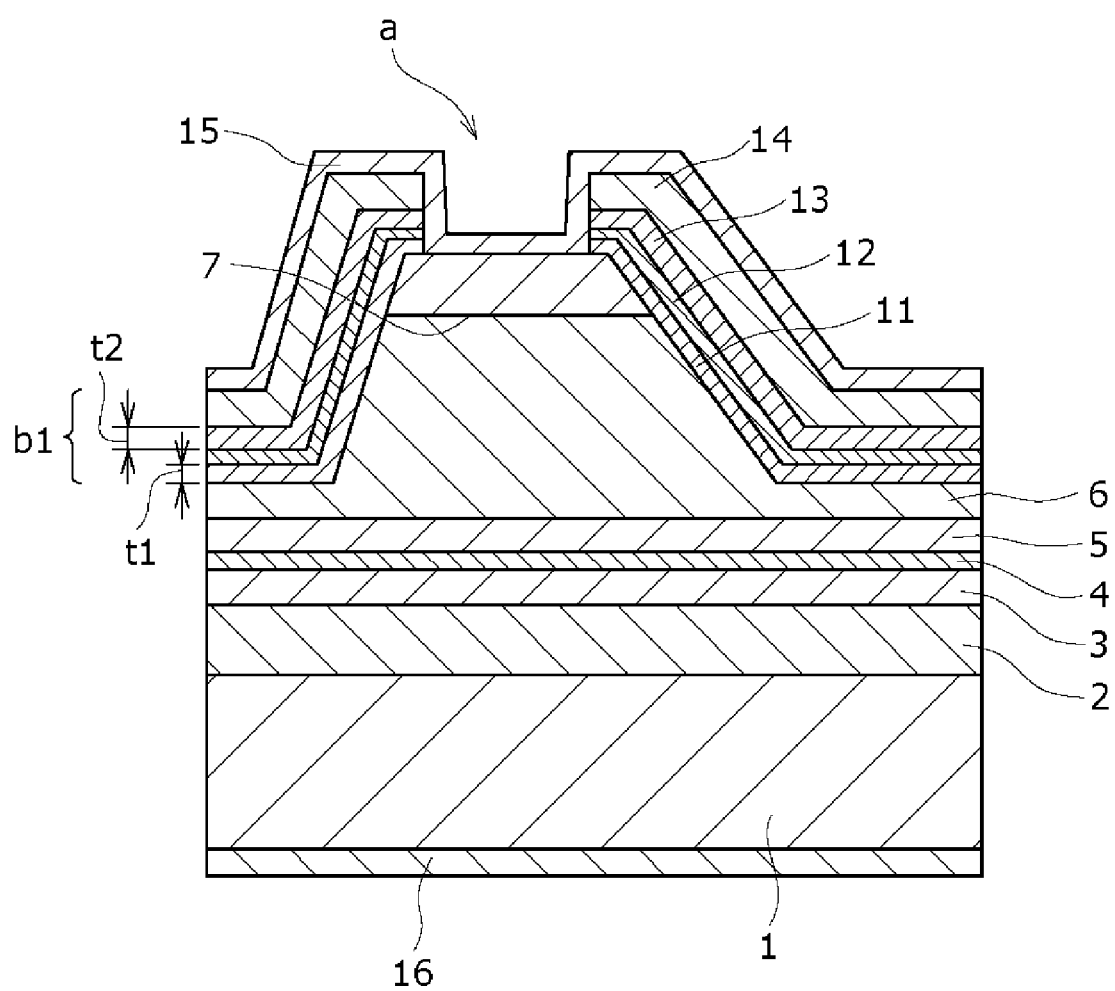
FIG. 1 is a sectional view showing the structure of the semiconductor laser according to the embodiment of the present invention.

FIG. 1 is a sectional view showing the structure of the semiconductor laser according to the embodiment. This semiconductor laser is an AlGaInP compound semiconductor laser to be used for recording on a DVD (Digital Versatile Disc). It is of effective index type having the stripe ridge structure.

The semiconductor laser is comprised of a GaAs substrate 1, a lower cladding layer 2, a lower guide layer 3, an active layer 4, an upper guide layer 5, an upper cladding layer 6, and a contact layer 7, which are sequentially arranged upward. The entire contact layer 7 and the upper part (about 1 μm) of the upper cladding layer 6 form the stripe ridge structure a.

The upper cladding layer 6 (spreading over the foot and slope of the ridge a) is covered with the buried film b1, which is comprised of a first low refractive index layer 11, a light absorbing layer 12, a second low refractive index layer 13, and an anti-oxidizing layer 14, which are sequentially arranged upward. The buried film b1 of laminate structure constitutes the central feature of the present invention. Incidentally, the buried film b1 is formed in such a way that the contact layer 7 constituting the top of the ridge a is exposed.

On the buried layer b1 is an upper electrode 15 which is in contact with the upper layer 7. On the reverse side of the GaAs substrate 101 is a lower electrode 16.

In what follows each of the layers arranged as mentioned above will be described in more detail.

The lower cladding layer 2 (which is arranged on the GaAs substrate 1) is formed from n-type AlGaInP, which has a composition of $(Al_{0.7}Ga_{0.3})_{0.5}In_{0.5}P$. A buffer layer for lattice matching may be placed between the GaAs substrate 1 and the lower cladding layer 2, although it is not shown in FIG. 1. It may be formed from n-type GaInP or n-type AlGaInP in which the content of Al is smaller than that in the lower cladding layer 2.

The lower guide layer 3 is formed from n-type AlGaInP, which has a composition of $(Al_{0.4}Ga_{0.6})_{0.5}In_{0.5}P$.

The active layer 4 is formed from GaInP.

The upper guide layer 5 is formed from p-type AlGaInP, which has the same composition of $(Al_{0.4}Ga_{0.6})_{0.5}In_{0.5}P$ as the lower guide layer 3.

The upper cladding layer 6 is formed from p-type AlGaInP, which has the same composition of $(Al_{0.7}Ga_{0.3})_{0.5}In_{0.5}P$ as the lower cladding layer 2.

The contact layer 7 is formed from p-type GaAs. A buffer layer for lattice matching may be placed between the upper cladding layer 6 and the GaAs contact layer 7, although it is omitted in FIG. 1. It may be formed from p-type GaInP or p-type AlGaInP in which the content of Al is smaller than that in the upper cladding layer 6.

The buried layer b1, which constitutes the feature of the present invention, is composed of the following layers.

The first low refractive index layer 11 is a non-absorbing layer which prevents the absorption of the laser beam generated by the active layer 4 of the semiconductor laser. It is formed from n-type AlInP $[Al_xIn_{(1-x)}P]$. This material should have a composition of $Al_{0.5}In_{0.5}P$ so that it forms a non-absorbing layer which does not absorb the laser beam.

The first low refractive index layer 11 may also be formed from n-type AlGaInP $[Al_xGa_{(1-x)}InP]$, in which the content of Ga is slightly reduced, or n-type AlGaAs $[Al_xGa_{(1-x)}As]$ in which the content of Ga is slightly reduced. These materials also form the non-absorbing layer which does not absorb the laser beam if they have an adequately controlled composition.

The first low refractive index layer 11 should have a thickness t1 which is as small as possible, say, no larger than 500 nm, preferably no larger than 100 nm. The small thickness permits the light absorbing layer 12 to be arranged close to the active layer 4.

The light absorbing layer 12 absorbs the laser beam generated by the active layer 4 of the semiconductor laser. It is formed from n-type GaAs. Alternatively, it may also be formed from n-type AlGaAs $[Al_xGa_{(1-x)}As]$ in which the content of Al is very small. The light absorbing layer 12 should be extremely thin, say, 1-20 nm, preferably 1-10 nm, typically 1.5 nm, if it is formed from n-type GaAs.

The second low refractive index layer 13 may be formed from the same material as used for the first low refractive index layer 11. It may also be formed from a material different from the one used for the first low refractive index layer 11. The thickness of the second low refractive index layer 13 should be about 200 nm.

The anti-oxidizing layer 14 is formed from n-type GaAs. Since GaAs is a material that forms the light absorbing layer 12 as mentioned above, the anti-oxidizing layer 14 functions also as a light absorbing layer. The thickness of the anti-oxidizing layer 14 should be about 200 nm, which is large enough to prevent oxidation.

Incidentally, a GaAs layer (not shown) may be arranged under the first low refractive index layer 11. This GaAs layer helps improve crystallinity of regrown layers on the first low refractive index layer 11. It also functions as a light absorbing layer.

The semiconductor laser constructed as mentioned above has the buried film Li that covers the foot and slope of the ridge a. The buried film b1 is comprised of the first low refractive index layer 11, the second low refractive index layer 13, and the light absorbing layer 12, which are sequentially arranged one over another. This buried film of layered structure has an advantage over the conventional buried film of single layer structure having only one low refractive index layer. The advantage is that the absorption coefficient for the zeroth-order mode is lower than that for the first-order mode (or higher-order mode) as mentioned in the following.

Figure 2:
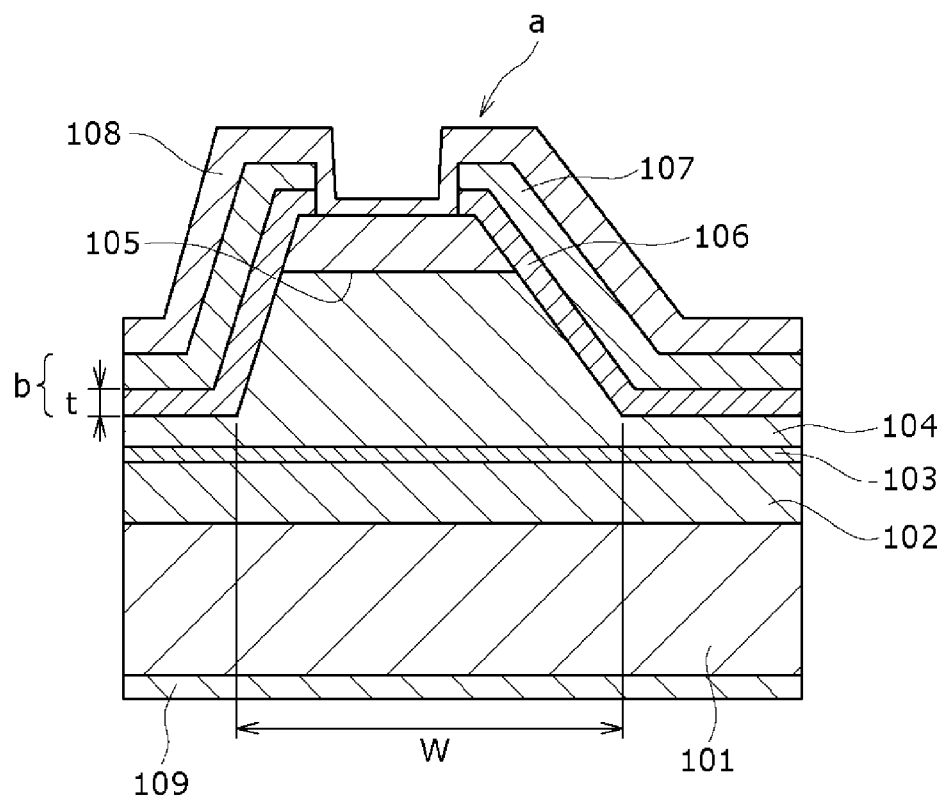
FIG. 2 is a sectional view showing the structure of the conventional semiconductor laser.
Figure 3:
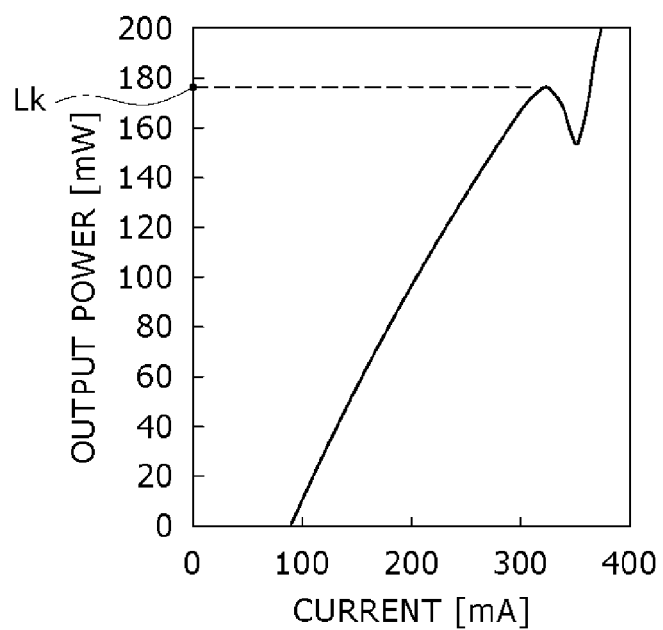
FIG. 3 is a diagram showing the L-I characteristics and the kink level of the semiconductor laser.

Table 1 below shows how the buried film b1 of double-layer structure (consisting of two low refractive index layers according to the embodiment of the present invention) differs from the buried film b of single-layer structure shown in FIG. 2 (consisting of one low refractive index layer according to the conventional technology) in the absorption coefficients for the zeroth-order mode and the first-order mode. Incidentally, the buried film b1 of double-layer structure has a total thickness (t1+t2) of 350 nm.

the light absorbing layer 12 interposed between them. Moreover, the low refractive index layers and the light absorbing layer may be formed from different materials or may be formed in different structures.

Moreover, it is assumed in the foregoing embodiment that the present invention is applicable to the semiconductor laser having the cladding layer of AlGaInP. However, the present invention may also be applicable to any semiconductor laser of effective index type having the stripe ridge structure. In such a case, the same effect as mentioned above will be produced if the low refractive index layers 11 and 13 and the light absorbing layer 12 are formed from proper materials suitable for desired wavelengths. For example, in the case where the present invention is applied to a semiconductor laser having the cladding layer of AlGaAs, the low refractive index layers 11 and 13 may be formed from AlInP, AlGaInP, or AlGaAs with a properly control composition to prevent them from absorbing the laser beam, and the light absorbing layer 12 may be formed from GaAs or AlGaAs with a properly controlled composition to permit them to absorb the laser beam.

It should be understood by those skilled in the art that various modifications, combinations, sub-combinations and alterations may occur depending on design requirements and

TABLE 1

| (Structure according to the embodiment) | | |
|---|---|---|
| Thickness of the first low refractive index film (nm) | Absorption coefficient for the zeroth-order mode ($cm^{-1}$) | Absorption coefficient for the first-order mode ($cm^{-1}$) |
| 50 | 662 | 3557 |
| 100 | 550 | 2884 |
| (Structure according to the conventional technology) | | |
| Thickness of low refractive index film (nm) | Absorption coefficient for the zeroth-order mode ($cm^{-1}$) | Absorption coefficient for the first-order mode ($cm^{-1}$) |
| 50 | 717 | 3563 |
| 100 | 578 | 2872 |

Total thickness (t1 + t2) of the low refractive index films is 350 nm.

Figure 4:
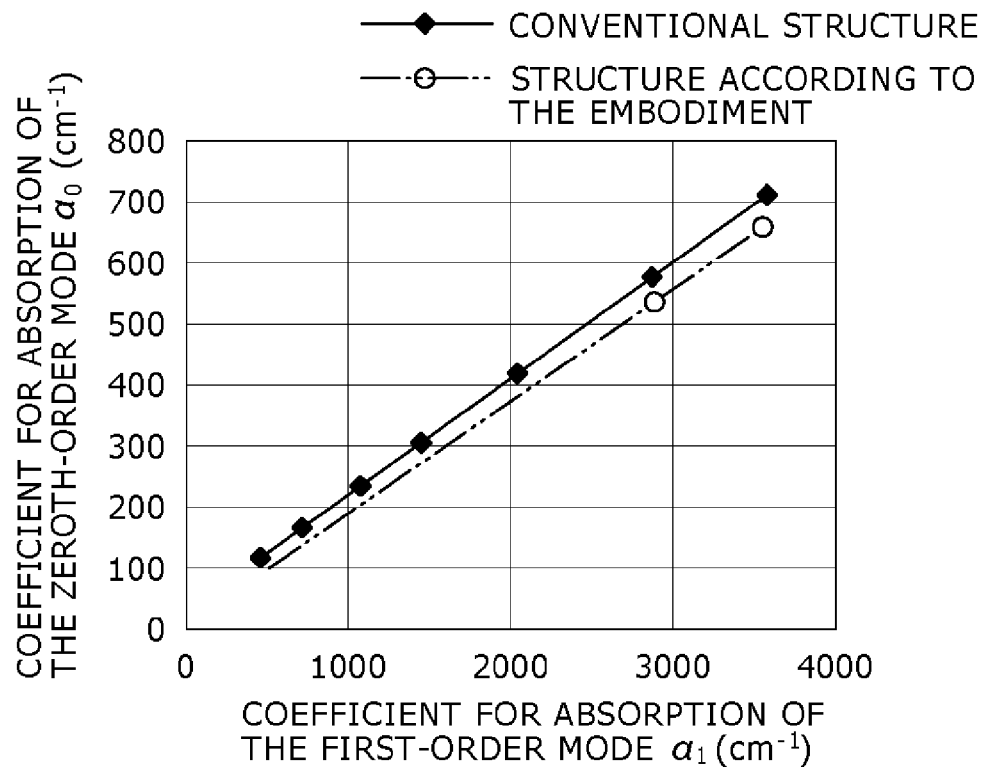
FIG. 4 is a diagram showing the absorption coefficient for the zeroth-order mode versus the absorption coefficient for the first-order mode.
Figure 5:
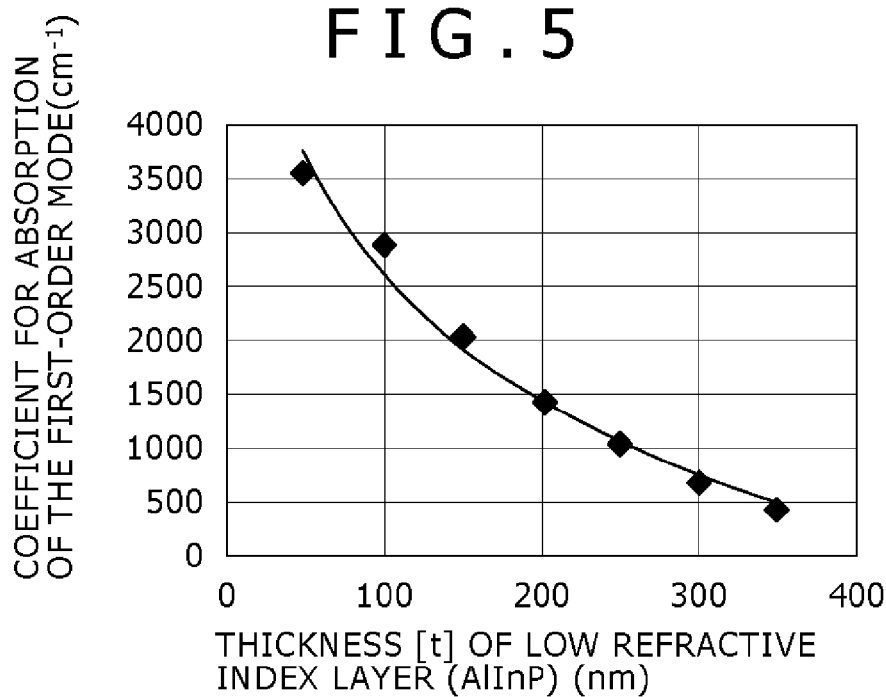
FIG. 5 is a diagram showing the absorption coefficient for the first-order mode plotted against the thickness of the low refractive index layer.

The results shown in Table 1 are graphically represented in FIG. 4.

It is to be noted from Table 1 and FIG. 4 that the structure according to the embodiment of the present invention has lower absorption coefficients for the zeroth-order mode and the first-order mode than the structure according to the conventional technology.

The semiconductor laser having the buried film b1 constructed as mentioned above has the advantage of keeping the absorption coefficient for the zeroth-order mode lower than that for the first-order mode (higher-order mode). In other words, the buried film b1 so functions as to keep absorption for the zeroth-order mode low, thereby increasing absorption for the higher-order mode. The result is that the semiconductor laser achieves a higher output.

The foregoing embodiment assumes that the buried film b1 is comprised of the first and second low refractive index layers 11 and 13 and the light absorbing layer 12 interposed between said two layers 11 and 13. However, the present invention is not limited to this layered structure; it may be comprised of three or more low refractive index layers, with other factors insofar as they are within the scope of the appended claims or the equivalents thereof.

What is claimed is:

1. A semiconductor laser comprising:
a lower cladding layer;
an upper cladding layer;
an active layer between the lower and upper cladding layers;
a buried layer on the upper cladding layer; and
two secondary absorption layers formed on opposite sides of the buried layer,
wherein,
the buried layer includes at least two low refractive index layers effective to prevent absorption of laser light with a light-absorbing layer interposed between the low refractive index layers effective to absorb laser light.

2. The semiconductor laser as defined in claim 1, wherein the upper cladding layer is formed from AlGaInP, the light-absorbing layer is formed from GaAs or AlGaAs, the secondary absorption layers are formed from GaAs, and the low refractive index layer is formed from AlInP, AlGaInP, or AlGaAs.

3. The semiconductor laser as defined in claim 1, wherein the upper cladding layer is formed from AlGaAs, the light-absorbing layer is formed from GaAs or AlGaAs, and the low refractive index layer is formed from AlInP, AlGaInP, or AlGaAs.

4. The semiconductor laser as defined in claim 1, wherein the buried layer has, as its uppermost layer, said light-absorbing layer which functions also as an anti-oxidizing layer.

* * * * *